United States Patent [19]
Chang

[11] Patent Number: 5,427,979
[45] Date of Patent: Jun. 27, 1995

[54] METHOD FOR MAKING MULTI-LEVEL ANTIFUSE STRUCTURE

[75] Inventor: Kuang-Yeh Chang, Los Gatos, Calif.

[73] Assignee: VLSI Technology, Inc., San Jose, Calif.

[21] Appl. No.: 138,298

[22] Filed: Oct. 18, 1993

[51] Int. Cl.$^6$ ............................................. H01L 21/441
[52] U.S. Cl. ..................... 437/190; 437/51; 437/922
[58] Field of Search ................ 437/51, 190, 192, 922; 257/529, 530; 148/DIG. 55

[56] References Cited

U.S. PATENT DOCUMENTS

| | | | |
|---|---|---|---|
| 5,070,384 | 12/1991 | McCollum et al. | 437/193 |
| 5,106,773 | 4/1992 | Chen et al. | 437/922 |
| 5,248,632 | 9/1993 | Tung et al. | 437/922 |

OTHER PUBLICATIONS

An FPGA Family Optmized for High Densities and Reduced Routing Delay, Ahrens et al., *IEEE 1990 Custom Integrated Circuits Conference*, 1990.

*Primary Examiner*—Chandra Chaudhari
*Attorney, Agent, or Firm*—Hickman & Beyer

[57] ABSTRACT

A multilevel antifuse structure characterized by a substrate, a first antifuse structure formed above the substrate, and a second antifuse structure formed above the first antifuse structure. The first antifuse structure preferably includes a first conductive layer, a first antifuse layer disposed over the first conductive layer, a first dielectric layer disposed over the first antifuse layer and provided with a first via hole, and a first conductive via formed within the first via hole. The second antifuse structure preferably includes a second conductive layer, a second antifuse layer disposed over the second conductive layer, a second dielectric layer disposed over the second antifuse layer and provided with a second via hole, and a second conductive via formed within the second via hole. Preferably, the first antifuse layer and the second antifuse layer are patterned into a plurality of antifuse regions which are either vertically aligned or vertically staggered with respect to each other. A method for making a multilevel antifuse structure in accordance with the present invention includes the steps of forming a first antifuse structure over a substrate, and forming a second antifuse structure over the first antifuse structure. In one embodiment, the first antifuse structure and the second antifuse structure are vertically aligned, and are interconnected in parallel. The parallel interconnection is preferably accomplished by tungsten vias formed by either a blanket tungsten deposition and subsequent etch-back, or by a selective tungsten deposition.

19 Claims, 3 Drawing Sheets

METHOD FOR MAKING MULTI-LEVEL ANTIFUSE STRUCTURE

BACKGROUND OF THE INVENTION

1. Field of the Invention

This invention relates generally to integrated circuit devices, and more particularly to integrated circuit devices employing antifuses.

2. Background of the Technical Art

The manufacture of integrated circuit (IC) devices includes the formation of metallization layers that are patterned to create interconnections between devices. Some IC interconnections are programmable, either with fuses or antifuses. An un-programmed fuse is a low-resistance link between or within metallization layers which can be "programmed" by being "blown", i.e. it can be caused to become non-conductive by applying a high enough current across it to "blow." Antifuses operate in an opposite fashion to standard fuses in that the "un-programmed" material used to form the antifuse has an intrinsically high resistance, and the programmed material has a relatively low resistance. By applying a programming current of about 10 milli-Amperes (mA), the electrical resistance through the anti-fuse material is greatly reduced, thus providing a conductive link between or within metallization layers. A typical material used in antifuses is amorphous silicon (A-Si) which has an intrinsic (un-programmed) resistivity of over 1 giga-ohm-cm.

A prior art antifuse structure is shown in cross-section in FIG. 1. A substrate 12 typically comprises a semiconductor wafer, such as a silicon wafer. An oxide layer 14 overlays the substrate 12, and can be formed by a variety of well-known processes such as chemical vapor deposition (CVD). A metal layer 16 is formed over the oxide layer, typically by a physical vapor deposition (PVD) process such as aluminum sputtering. The metal layer 16 is covered by a second oxide layer 18 which has a via formed through it by standard masking and etching techniques that are well known to those skilled in the art. An antifuse material (such as A-Si) can then be deposited in the via 20 to form an antifuse structure 22. The antifuse material is typically deposited by blanket deposition and etch-back to fill the via. A metal layer 24 (usually aluminum or an aluminum alloy) is then formed over the oxide layer 18 and the antifuse structure 22, again typically by a PVD process. In an actual process, barrier layers such as barrier metal layers made from TiW preferably separate the A-Si from the aluminum metal layers to minimize A-Si degrading alloy-type interactions. This can be accomplished by providing a thin film of the barrier layer on top of metal layer 16 and on the bottom of metal layer 24.

Programming of the antifuse structure 22 is accomplished by providing a current of about 10 mA between metal layer 16 and the metal layer 24. Before programming, the antifuse structure 22 has a resistance of above 1 giga-ohms for a 1 micron diameter via 20. A programmed antifuse forms a conductive path 26 between metal layers 16 and 24 having a resistance typically of about 20–100 ohms.

Antifuse structures allow for much higher programmable interconnection densities than standard fuse structures. However, antifuse structures exhibit a relatively high programmed resistance, which can be problematical in some applications. Actel Corporation describes their solution to this problem in "An FPGA Family Optimized for High Densities and Reduced Routing Delay", Ahrens et al, *IEEE* 1990 *Custom Integrated Circuits Conference*, 1990. This article presents a method for arranging antifuses in a single layer and coupling them in parallel to reduce their resistance. While the Actel solution reduces the programmed resistance problem, it also reduces the antifuse density on the integrated circuit.

SUMMARY OF THE INVENTION

The present invention provides a method and structure for increasing the density of antifuse regions on a semiconductor substrate. A number of antifuse regions can be coupled together in parallel to reduce the resistance of a programmed antifuse structure, or the greater density can be used to provide a greater number of antifuse structures within a given area of the semiconductor substrate.

A multilevel antifuse structure, in accordance with the present invention, includes a substrate, a first antifuse structure formed above the substrate, and a second antifuse structure formed above the first antifuse structure. Preferably, the first antifuse structure includes a first conductive layer, a first antifuse layer disposed over the first conductive layer, a first dielectric layer disposed over the first antifuse layer and provided with a first via hole, and a first conductive via formed within the first via hole. The second antifuse structure preferably includes a second conductive layer, a second antifuse layer disposed over the second conductive layer, a second dielectric layer disposed over the second anti fuse layer and provided with a second via hole, and a second conductive via formed in the second via hole.

Preferably, the first antifuse layer and the second antifuse layer are patterned into a plurality of antifuse regions. In a first embodiment of the present invention, the antifuse regions of the first and second layers are substantially vertically aligned such that the vias of the first antifuse layer are in physical and electrical contact with corresponding antifuse regions of the second antifuse layer. In another embodiment of the present invention, the regions of the first antifuse layer and the second antifuse layer are not vertically aligned such that antifuse regions of the second antifuse layer are not in direct physical contact with the vias of the first antifuse layer. In this instance, conductive lines can be provided to couple antifuse regions of the first antifuse layer to antifuse regions of the second antifuse layer.

A method for making a multilevel antifuse structure, in accordance with the present invention includes the steps of forming a first antifuse structure over a substrate, and forming a second antifuse structure over the first antifuse structure. Preferably, the step of forming a first antifuse structure includes the steps of forming a first antifuse region, forming a dielectric layer over the first antifuse region, where the dielectric layer has a first via hole aligned with the first antifuse region, and forming a first conductive via within the first via hole which is in electrical contact with the first antifuse region. A preferred method for making the second antifuse structure includes the steps of forming a second antifuse region over the first antifuse region, forming a dielectric layer over the second antifuse region, where the dielectric layer has a second via hole aligned with the second anti fuse region, and forming a second conductive via within the second via hole which is in electrical contact with the second antifuse region. The method can also include the step of connecting the first antifuse structure and the second antifuse structure in parallel.

A further method for making a multilevel antifuse structure, in accordance with the present invention, comprises the steps of (a) providing a conductive layer; (b) patterning the conductive layer; (c) providing an antifuse layer over the patterned conductive layer; d) patterning the antifuse layer to form a plurality of antifuse regions; (e) providing a dielectric layer over the patterned antifuse layer; (f) creating a plurality of via holes aligned with the plurality of antifuse regions; (g) filling the plurality of via holes with a conductive material such that a plurality of conductive vias are in electrical contact with the plurality of antifuse regions, thereby providing a plurality of antifuse structures formed on a common level; and (h) repeating steps (a) to (g) at least one time to provide a plurality of antifuse structures on a new common level which is over the common level of the previously provided plurality of antifuse structures.

As described previously, the antifuse structures on adjacent levels can be either vertically aligned or not vertically aligned. If they are not vertically aligned, a further step of creating a number of conductive lines to electrically couple the conductive vias of a lower adjacent level to antifuse regions of an adjacent upper level is provided. In this instance, the plurality of conductive lines in the plurality of conductive vias are preferably aluminum or an aluminum alloy. Alternatively, if the antifuse structures on adjacent levels are substantially vertically aligned such that conductive vias of a lower adjacent level are in electrical contact with antifuse regions of an adjacent upper level, the conductive vias preferably comprise a refractory metal such an tungsten. The tungsten metal vias are preferably made either by a blanket tungsten layer deposition followed by an etch-back, or are formed by a selective tungsten deposition process.

DETAILED DESCRIPTION OF THE PREFERRED EMBODIMENTS

Figure 1:
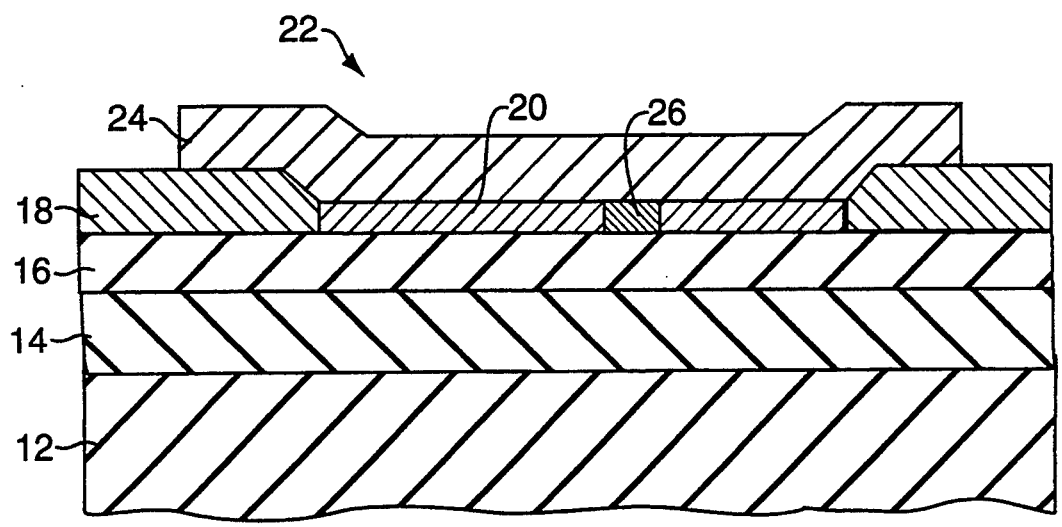
FIG. 1 illustrates a prior-art antifuse structure.
Figure 2:
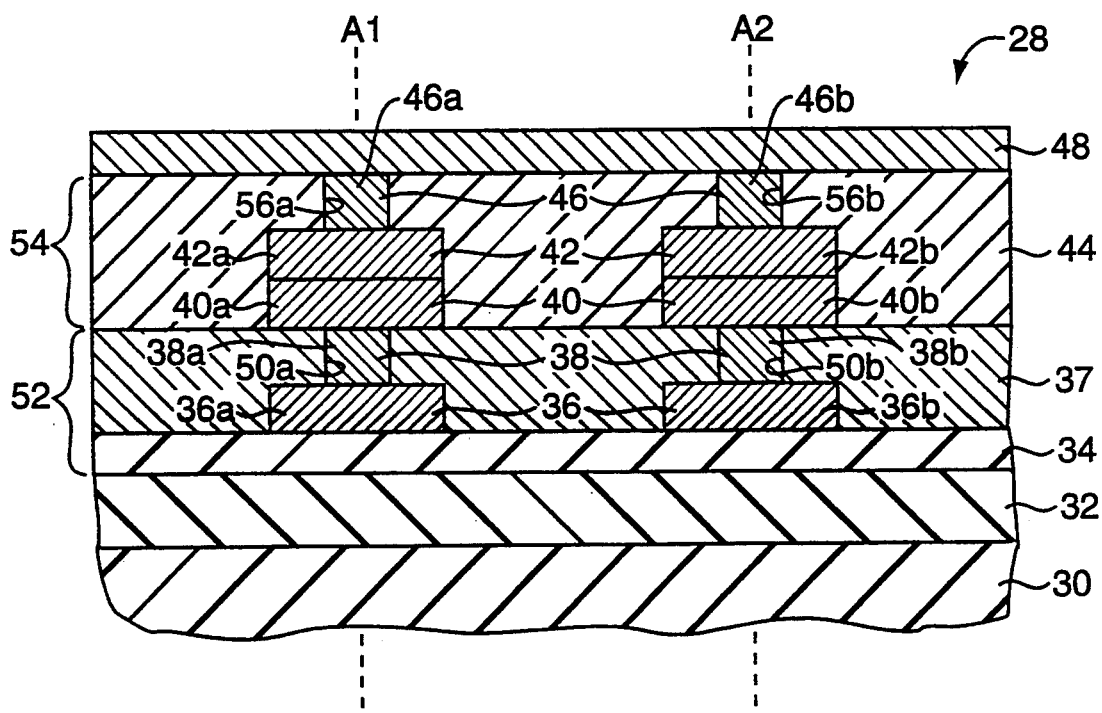
FIG. 2 illustrates a multilevel antifuse structure in accordance with the present invention.

FIG. 1 illustrates an antifuse structure of the prior art. In FIG. 2, an antifuse structure 28 of the present invention preferably includes a substrate 30, a base dielectric layer 32, a first conductive layer 34, a first antifuse layer 36, a first dielectric layer 37, a first pair of conductive vias 38, a second conductive layer 40, a second antifuse layer 42, a second dielectric layer 44, a second pair of conductive vias 46, and a third conductive layer 48.

The substrate 30 is preferably a semiconductor substrate made from such materials as silicon. The base dielectric layer 32 is typically an oxide layer comprising silicon dioxide ($SiO_2$) formed by any number of conventional processes, such as a chemical vapor deposition (CVD) process. The first conductive layer 34 is preferably a three-level sandwich of conductive materials comprising a first layer of titanium tungsten (TiW) deposited to a thickness of 2000 angstroms, a second layer of aluminum or an alloy of aluminum and copper deposited to a thickness of 4000 angstroms, and a third layer of titanium tungsten deposited to a depth of 1000 angstroms.

The various metal layers of the first conductive layer 34 can be deposited by a number of processes. Preferably, the first conductive layer 34 is deposited by a first sputter deposition of TiW followed by the sputter deposition of Al or AlCu (at a ratio of approximately 99:1), finally followed by a sputter deposition of TiW. The first conductive layer 34 is then preferably patterned into conductive lines, as is well known to those skilled in the art. As used herein, the term "patterned" preferably refers to photolithographic techniques whereby a resist material is applied to the upper surface of the substrate, is exposed to a pattern of radiant energy, and is then developed to form a mask. An etching process is then undertaken to etch the surface of the substrate through the mask. At the end of the photolithography process, the mask is typically removed.

After the first conductive layer has been deposited and patterned, the first antifuse layer 36 is deposited. Preferably, the antifuse layer 36 comprises amorphous silicon (A-Si) which has an intrinsic resistance in the millions of ohms in its un-programmed state, and has a resistance of about 50 ohms in its programmed state. The first antifuse layer 36 is then patterned to form a plurality of first antifuse regions, such as antifuse region 36a and 36b. Each of these antifuse regions comprise: a portion of a single antifuse element that can be programmed by the user.

Second dielectric layer 37 is again, preferably, a layer of silicon dioxide deposited to a depth of 8000 angstroms. A plurality of via holes, such as first via holes 50a and 50b, are patterned into the first dielectric layer 37 by conventional oxide etching techniques. Next, conductive via plugs 38a and 38b using materials such as Tungsten are formed within the via holes 50a and 50b.

First conductor layer 34 first antifuse layer 36, first dielectric layer 37, and first pair of conductive vias 38 comprise a first antifuse structural level 52. A similar, second antifuse structure level 54 is formed over or on top of the first antifuse structure level 52. It should be noted that additional levels (not shown) can be similarly stacked above the second antifuse structural level 54 to provide additional antifuse devices, or to further reduce the resistance of an antifuse structure by coupling it in parallel with one or more other similar antifuse structures.

The second antifuse structural level has, as a first layer, the second conductive layer 40. This second conductive layer is, again, preferably a three-level sandwich of TiW, Al and TiW, which is formed in a similar manner as the first conductive layer 34. The second conductive layer 40 is then similarly patterned to form a number of conductive lines, such as conductive lines 40a and 40b. Next, the second antifuse layer 42 is deposited and patterned to form a number of antifuse regions, such as antifuse regions 42a and 42b. The second dielectric layer 44 is then formed over the second antifuse layer 42, and second via holes 56a and 56b are formed by standard patterning techniques. The vias 56a and 56b are then filled with a conductor to form the second pair of vias 46, as illustrated at 46a and 46b. Thus, the second antifuse structural level 54 includes the second conductive layer 40, the second antifuse layer 42, the second dielectric layer 44, and the via layer 46.

If second antifuse structure 54 is to be the top antifuse structure level then, typically, a third metal layer 48 would be formed over the top of it. Alternatively, another antifuse structural level similar to antifuse structure levels 52 and 54 can be formed over the top of second antifuse structure level 54. The number of levels N of antifuse structures is only limited by current processing techniques. As a practical matter, using current processing techniques, it may be difficult to form more than three antifuse structure levels.

The third conductive layer 48 is, again, preferably a sandwich of TiW, Al and TiW. The third conductive layer 48 is preferably patterned by conventional photolithography techniques to form conductive lines which couple the antifuse structure 28 of the present invention to other circuit elements of the integrated circuit.

Figure 3:
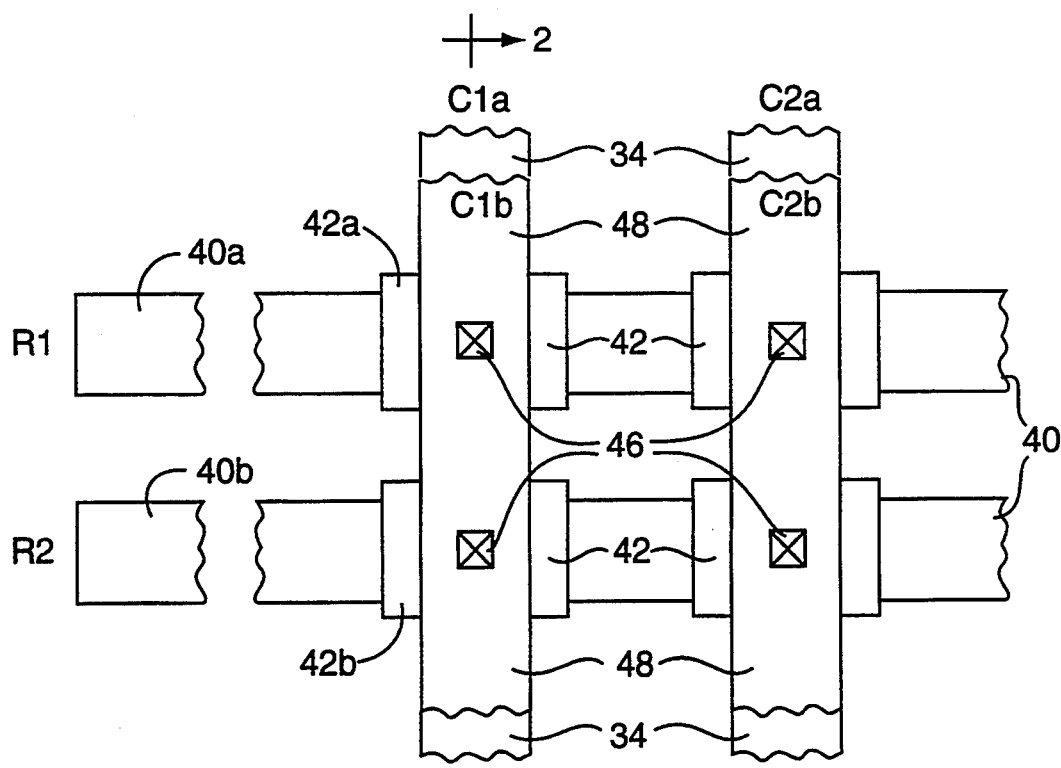
FIG. 3 is a top-plan view of the antifuse structure shown in FIG. 2.

In FIG. 3, a top-plan view of the antifuse structure 28 is shown. As seen in this figure, the first conductive layer 34 has been patterned into two "column" interconnects labeled column C1a and C2a. Second conductive layer 40 has been patterned into a pair of "row" traces labeled R1 and R2 which correspond to traces 40a and 40b of FIG. 2. The second antifuse layer 42 can be seen to be patterned into a number of antifuse regions, such as the antifuse regions 42a and 42b. The antifuse regions are electrically coupled to the column traces C1b and C2b by the conductive vias 46.

It should be noted that the layout of the structural elements of FIGS. 2 and 3 are somewhat arbitrary. For example, the directions of the rows and columns can be reversed, or they can be formed in parallel. Also, while the antifuse regions such as antifuse regions 42a and 42b are shown to be rectangular in shape, they can also be other shapes, such as circular. The important things to note in FIGS. 2 and 3 are that one set of antifuse structures are formed vertically above the other set of antifuse structures, and, in the embodiments of FIGS. 2 and 3 there is a vertical alignment between the antifuse structures of the two levels.

It is also important to note that the structure illustrated in FIGS. 2 and 3 can be used to couple two, vertically aligned antifuse regions together, by coupling together the column pairs. For example, antifuse regions 36a and 42a can be coupled in parallel by coupling together columns C1a and C1b. Coupling together columns C1a and C1b also couples all of the other antifuse region pairs along that column together, such as the antifuse region pairs 36b and 42b. This reduces the combined electrical resistance of the antifuse pairs. Alternatively, the columns such as C1a and C1b can be used to separately address the antifuse regions. In this instance, twice as many antifuse regions can be provided for the same surface area as the substrate 30 as in the structures of the prior art.

Figure 4:
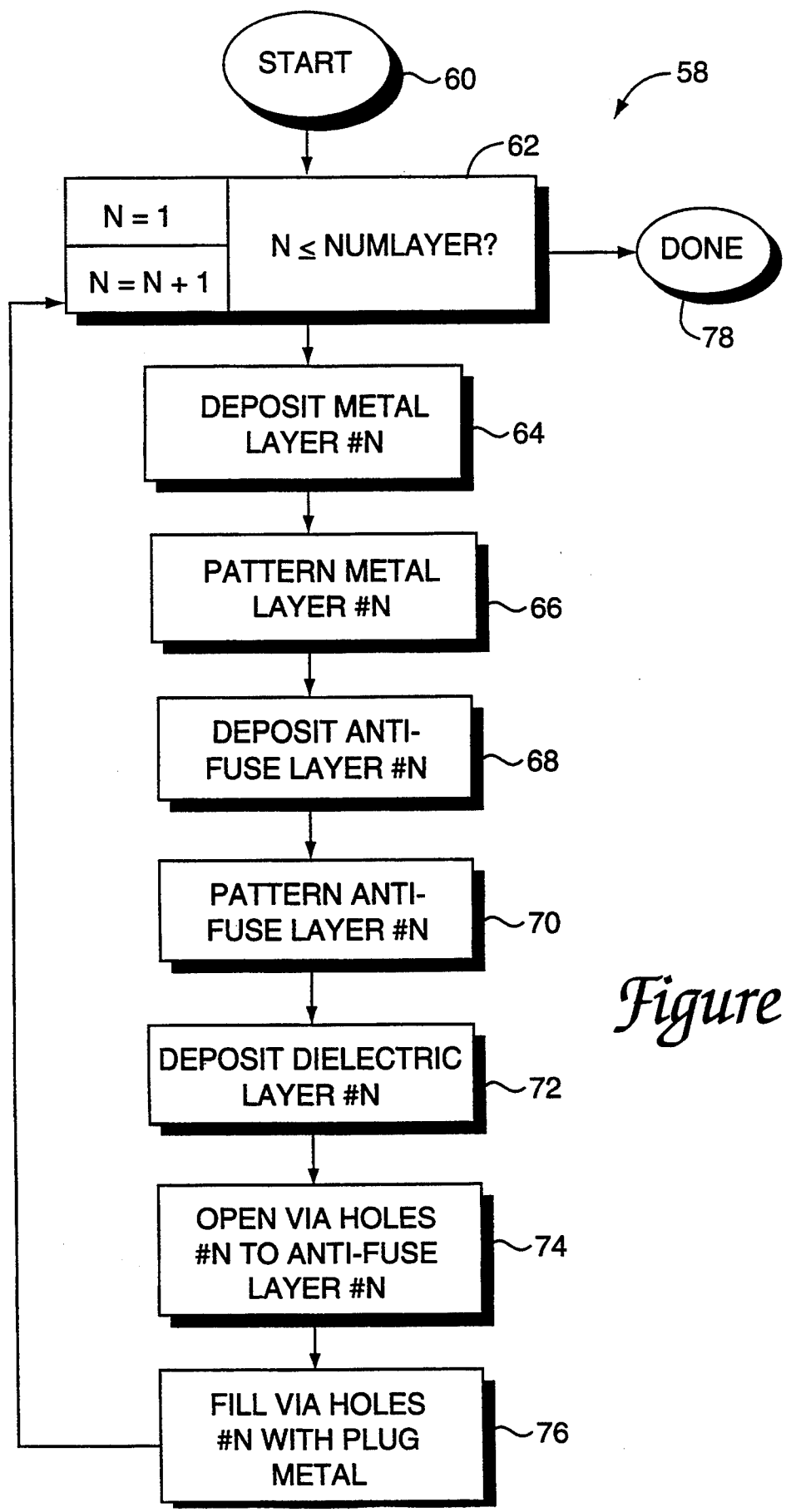
FIG. 4 is a flow diagram illustrating a method for making a multilevel antifuse structure in accordance with the present invention.

In FIG. 4, a process for making an antifuse structure 28 of the present invention is shown in flow-diagram form. The process begins at a step 60 and, in an iterative loop step 62, a counter N is initialized to 1. The counter N is then compared with a variable NUMLAYER which is the number of layers of antifuses to be formed. In this example, NUMLAYER=2. Next, in a step 64, metal layer N is deposited. The metal layer N is patterned in a step 66, and an antifuse layer N is deposited in step 68. Next, in a step 70, the antifuse layer N is patterned, and in a step 72 the dielectric layer N is deposited. Via holes N to the antifuse layer N are opened in a step 74, and the via holes N are filled with metal in a step 76. Process control then returns to step 62 where the counter N is incremented by 1 and is again compared to NUMLAYER. Since, in this example, N=2 at this point in the process, steps 64–76 are repeated to provide a level number 2. The counter N is then iterated again in step 62, is compared to the variable NUMLAYER, and the process is completed at 78.

It should be noted that the process 58 of the present invention can produce any arbitrary number of antifuse layers. However, from a practical processing point of view, the number of layers is preferably within the range of 2–3 layers.

The individual process step 64–76 will be discussed now in greater detail. In the first step 64, a metal layer 1 (such as metal layer 34 of FIG. 2) is formed. As mentioned previously, metal 1 is preferably a TiW-Al-TiW metal sandwich formed by plasma sputter deposition. Preferably, the bottom TiW layer is approximately 2,000 angstroms thick, the middle Al layer is 4,000 angstroms thick, and the top TiW layer is 1000 angstroms thick. It is important to have at least the top TiW layer since aluminum can "poison" amorphous silicon by the migration of Al atoms into the A-Si material. This top TiW layer therefore forms a barrier layer between the Al and the A-Si. Then, in step 66, metal layer 1 is patterned. As explained previously, and is well-known to those skilled in the art, this patterning typically takes the form of a photolithographic process.

In step 68, the antifuse layer 1 is deposited. Preferably, the antifuse material is amorphous silicon (A-Si) and is deposited to a thickness of 1,500 angstroms in a plasma enhanced chemical vapor deposition (PECVD) process, the mechanics of which are well-known to those skilled in the art. The amorphous silicon is then patterned into regions such as regions 36a and 36b. Typical dimensions of regions 36a and 36b (FIG. 2) is about 3×3 microns. Next, in a step 72, a dielectric layer (such as the oxide layer 37 of FIG. 2) is deposited. The dielectric is preferably silicon dioxide ($SiO_2$) deposited to a thickness of 1 micron (10,000 angstroms) by a chemical vapor deposition (CVD) process. The dielectric layer 1 is then patterned to "open" link vias. Preferably, the link vias are about 0.8×0.8 microns in dimension and are centered over the A-Si regions 36a and 36b.

Next, in a step 76, the via holes are filled with plug metal. In the structure 28, illustrated in FIG. 2, this metal is preferably tungsten (W) for a variety of reasons. For one, tungsten (unlike aluminum), can be deposited into via holes substantially free of voids, fissures, and other defects. Furthermore, tungsten (unlike aluminum), can be in direct physical contact with amorphous silicon without the need of a barrier layer. Also, the relatively low surface mobility of tungsten (as opposed to the high-surface mobility of aluminum) reduces undesirable electromigration.

There are two preferred modes for providing tungsten vias to practice the method of the present invention. A first mode is a selective CVD tungsten deposition where the W grows substantially only within the vias and not on top of the oxide layer. If a selective W grows above the top of the dielectric (oxide) layer, an etch-back process can be used to planarize the wafer.

Alternatively, a blanket W deposition process can be used with a subsequent etch-back to remove the W from the surface of the dielectric layer. The disadvantage of the blanket W process is that the etch-back step can produce an irregular upper surface for the W via plug. However, blanket W deposition and subsequent etch back is a better known and more widely practiced process, so there are trade-offs between the selective W and blanket W methodologies.

Whether the W via plug is created by blanket or selective W deposition, its preferred thickness is approximately 0.5 microns (5,000 angstroms). As an additional, optional step prior to tungsten deposition, titanium tungsten (TiW) or titanium can be sputtered to a depth of about 200 angstroms to help adhesion for the W via plug.

As mentioned previously, the antifuse regions can be programmed, addressed, and read on an individual basis; or two or more antifuse regions can be coupled in parallel to reduce the resistance of the antifuse region. This can be very useful because a programmed antifuse link is approximately 30–100 ohms, regardless, of the size of the antifuse region. This is because a conductive path is formed through the amorphous silicon by the programming voltage, while the majority of the antifuse region still exhibits a high resistance. Since each antifuse region is going to have an average resistance of, for example 50 ohms, the effective resistance of an antifuse structure comprising the parallel connection of two antifuse regions will be 50 percent less, e.g. 25 ohms. If three antifuse regions are connected in parallel, the effective resistance will be $\frac{1}{3}$ of that of a single antifuse region, or about 17 ohms. Therefore, following this example line, a four-level antifuse structure having four antifuse regions connected in parallel will result in an antifuse structure having a programmed resistance of about 10 ohms. An antifuse structure with a low resistance is more electrically efficient, reducing power requirements of the system and reducing the generated heat.

Alternatively, other than coupling a number of antifuse regions together, the antifuse regions can be accessed individually. This allows a much higher density of antifuse structures per unit area of substrate. For example, a two-level structure will double the number of antifuses per unit area, and a three-level structure will triple the number of antifuse structures per unit area, etc.

Figure 5:
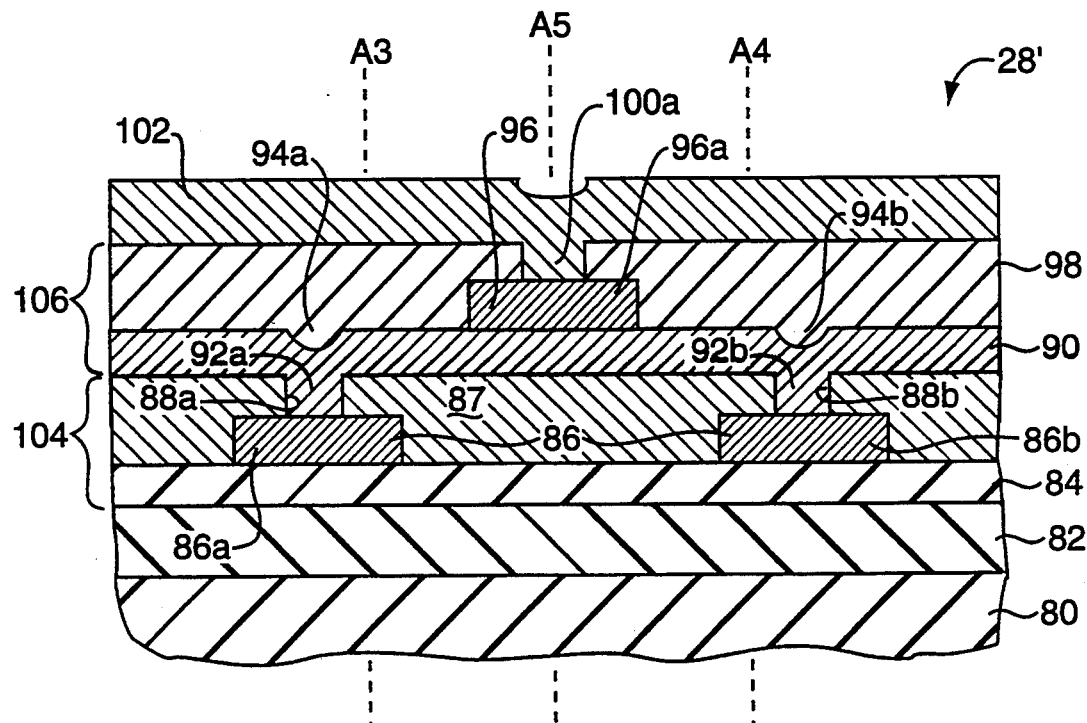
FIG. 5 is a cross-sectional view of a multilevel antifuse: structure in accordance with an alternate embodiment of the present invention.

In FIG. 5, an alternate embodiment for an antifuse structure 28' is illustrated. In FIG. 5, a semiconductor (preferably silicon) substrate 80 is provided with a dielectric (preferably SiO$_2$) layer 82 and a patterned metal layer 84. The metal layer 84 is, again, preferably a three-level sandwich of TiW/Al/TiW formed in substantially the same way and with substantially the same parameters as discussed previously. Next, an antifuse layer 86 is deposited and patterned to produce antifuse regions 86a and 86b. A dielectric layer 87 (preferably SiO$_2$) is formed as before and via holes 88a and 88b are opened over the amorphous silicon regions 86a and 86b, respectively, as described previously. Next, a metal layer 90 is formed which extends down into via holes 88a and 88b to form via plugs 92a and 92b, respectively. Again, the metal layer 90 is preferably a three-level sandwich of TiW/Al/TiW so that the aluminum of the three-level sandwich does not contact the amorphous silicon regions 86a and 86b to prevent aluminum poisoning of the amorphous silicon.

It will be noted that the metal line 90 over the via holes 88a and 88b exhibit depressions 94a and 94b. These depressions disturb the planarity of the metal line 90 or make it difficult to produce amorphous regions directly above the via. holes 88a and 88b, for example. In other words, while the amorphous silicon regions of antifuse structure 28 (FIG. 2) are vertically aligned, such as along axes A1 and A2, the antifuse regions of the antifuse structure 28' are preferably not vertically aligned, i.e., the antifuse regions are staggered in position between adjacent levels. Therefore, while antifuse region 86a is aligned with an axis A3 and antifuse structure 86b is aligned with an axis A4, an antifuse region 96a made from an antifuse layer 96 formed over the metal line 90 is vertically aligned with yet another axis A5. Of course, antifuse regions 86a and 86b can be vertically aligned along axes A3 and A4, respectively, with antifuse regions of non-adjacent levels. A dielectric layer 98 is formed over the antifuse layer 96 and via holes, such as a via hole 100a, are formed as described previously. Finally, a metal layer 102 is deposited and patterned. Again, the metal layer 102 is preferably a three-level sandwich including TiW/Al/TiW.

Again, the process steps for forming structure 28' are very similar to those discussed previously. An arbitrary number of levels N can be formed where the first level of structure 28' is shown at 104, and the second level of structure 28' is shown at 106. Also, as mentioned previously, the antifuse regions can be programmed, addressed, and read either singly or in combination.

A programming example of the present invention will be discussed with reference to FIG. 2. Programming of the antifuses is limited by the current drive capability of the driver transistors and the current sink capability of the chip. For example, if the antifuse regions 36a and 36b are to be programmed simultaneously, the metal line 34 will be used as the common ground. The two metal lines 40a and 40b will be driven by two separate driver transistors of the chip. These driver transistors will provide a programming voltage of about 12 V d.c. and a programming current of about 10 mA. Similarly, if the antifuse regions 36a and 42a are to be programmed simultaneously, the metal line 40a will be used as the common ground. The metal lines 34 and 48 will be driven by two separate driver transistors.

It should be noted that if the ground line selection is reversed, the antifuse regions cannot be programmed together. For example, in the case of programming antifuse regions 36a and 36b, it may be assumed that metal lines 40a and 40b are used as a common ground and metal line 34 is connected to the driver transistor. The antifuse region which programs first will sink all of the programming current and the other antifuse region will not program.

If the antifuse regions are to be programmed separately, then all such restrictions are removed. Generally speaking, as is well known to those skilled in the art, there is a preferred direction for programming an antifuse, i.e. either top down or bottom up, depending upon the processing and configuration of the antifuse structure. This choice may not be possible if simultaneous programming (as described above) is desired. For this and other reasons (e.g. limitations on drive current), separate programming of the antifuse regions is normally preferred. To separately program antifuse regions, a programming voltage of about 12 V d.c. and a programming current of about 10 mA is individually and sequentially applied to selected antifuse regions.

While this invention has been described in terms of several preferred embodiments, equivalents and extensions of the present invention will be apparent to those skilled in the art upon a study of the preceding specification and of the drawings. It is therefore intended that the following appended claims include all such equivalents and extensions as fall within the true spirit and scope of the present invention.

What is claimed is:

1. A method for making a multi-level antifuse structure comprising the steps of:
   forming a first antifuse structure over a substrate by:
   (a) forming a first antifuse region;
   (b) forming a dielectric layer over said first antifuse region, said dielectric layer having a first via hole aligned with said first antifuse region; and
   (c) forming a first conductive via within said first via hole which is in electrical contact with said first antifuse region; and
   forming a second antifuse structure over said first antifuse structure.

2. A method for making multi-level antifuse structure as recited in claim 1 wherein:
   said first antifuse structure comprises a first amorphous silicon antifuse layer over said substrate; and
   said second antifuse structure comprises a second amorphous silicon antifuse layer over said first antifuse structure.

3. A method for making a multi-level antifuse structure as recited in claim 1 further comprising the steps of:
   connecting said first antifuse structure and said second antifuse structure in parallel.

4. A method for making a multi-level antifuse structure as recited in claim 1 wherein said step of forming a second antifuse structure comprises the steps of:
   forming a second antifuse region in vertical alignment with said first antifuse region such that said second antifuse region is in electrical contact with said first via conductive via.

5. A method for making a multi-level antifuse structure as recited in claim 1 wherein said step of forming a second antifuse structure comprises the steps of:
   forming a second antifuse region which is displaced from vertical alignment with said first antifuse region such that said second antifuse region is not in direct physical contact with said first conductive via.

6. A method for making a multi-level antifuse structure as recited in claim 5 further comprising the step of electrically coupling said first conductive via to said second antifuse region.

7. A method for making a multi-level antifuse structure as recited in claim 1 wherein said step of forming a second antifuse structure comprises the steps of:
   forming a second antifuse region over said first antifuse region;
   forming a dielectric layer over said second antifuse region, said dielectric layer having a second via hole aligned with said second antifuse region; and
   forming a second conductive via within said second via hole which is in electrical contact with said second antifuse region.

8. A method for making a multi-level antifuse structure as recited in claim 7 wherein said second antifuse region is vertically aligned with said first antifuse region such that said second antifuse structure is in electrical contact with said first conductive via.

9. A method for making a multi-level antifuse structure as recited in claim 7 wherein said second antifuse regions is not vertically aligned with said first antifuse region, and further comprising the step of electrically coupling said first conductive via to said second antifuse region.

10. A method for making a multi-level antifuse structure comprising the steps of:
    (a) providing a conductive layer;
    (b) patterning the conductive layer;
    (c) providing an antifuse layer over said patterned conductive layer;
    (d) patterning said antifuse layer to form a plurality of antifuse regions;
    (e) providing a dielectric layer over said patterned antifuse layer;
    (f) creating a plurality of via holes aligned with said plurality of antifuse regions;
    (g) filling said plurality of via holes with a conductive material such that a plurality of conductive vias are in electrical contact with said plurality of antifuse regions, thereby providing a plurality of antifuse structures formed on a common level; and
    (h) repeating steps (a) to (g) at least one time to provide a plurality of antifuse structures on a new common level which is over the common level of the previously provided plurality of antifuse structures.

11. A method for making a multi-level anti fuse structure as recited in claim 10 wherein antifuse structures on adjacent levels are not vertically aligned.

12. A method for making a multi-level antifuse structure as recited in claim 11 further comprising the step of creating a plurality of conductive lines to electrically couple said conductive vias of a lower adjacent level to antifuse regions of an adjacent upper level.

13. A method for making a multi-level antifuse structure as recited in claim 12 wherein said plurality of conductive lines and said plurality of conductive vias comprise aluminum(Al).

14. A method for making a multi-level antifuse structure as recited in claim 10 wherein antifuse structures on adjacent levels are vertically aligned such that the conductive vias of a lower adjacent level are in electrical contact with antifuse regions of an adjacent upper level.

15. A method for making a multi-level antifuse structure as recited in claim 14 wherein said conductive vias comprise a refractory metal.

16. A method for making a multi-level antifuse structure as recited in claim 15 wherein said refractory metal comprises tungsten (W).

17. A method for making a multi-level antifuse structure as recited in claim 16 wherein said conductive vias are formed by the steps of:
    providing a blanket layer comprising tungsten over said dielectric layer and within said via holes; and
    etching-back said blanket layer comprising tungsten to form said conductive vias.

18. A method for making a multi-level antifuse structure as recited in claim 16 wherein said conductive vias are formed by selective deposition of a material comprising tungsten.

19. A method for making a multi-level antifuse structure as recited in claim 18 further comprising the step of etching-back said material comprising tungsten.

* * * * *